(12) United States Patent
Onuma et al.

(10) Patent No.: US 11,646,178 B2
(45) Date of Patent: May 9, 2023

(54) APPARATUS FOR PLASMA PROCESSING

(71) Applicant: Tokyo Electron Limited, Tokyo (JP)

(72) Inventors: Yuji Onuma, Miyagi (JP); Hideo Kato, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 29 days.

(21) Appl. No.: 17/241,755

(22) Filed: Apr. 27, 2021

(65) Prior Publication Data

US 2021/0351012 A1    Nov. 11, 2021

(30) Foreign Application Priority Data

May 11, 2020 (JP) .............................. JP2020-083195

(51) Int. Cl.
*H01J 37/32* (2006.01)
(52) U.S. Cl.
CPC ..... *H01J 37/32311* (2013.01); *H01J 37/3299* (2013.01); *H01J 37/32201* (2013.01); *H01J 37/32266* (2013.01); *H01J 37/32926* (2013.01); *H01J 37/32972* (2013.01); *H01J 37/3222* (2013.01); *H01J 37/32229* (2013.01); *H01J 37/32275* (2013.01); *H01J 37/32935* (2013.01)
(58) Field of Classification Search
CPC ......... H01J 37/32192–32311; H01J 37/32201; H01J 37/32266; H01J 37/32926; H01J 37/32972; H01J 37/3299; H01J 37/3222; H01J 37/32229; H01J 37/32275; H01J 37/32935
See application file for complete search history.

(56) References Cited

U.S. PATENT DOCUMENTS

| 5,079,507 A * | 1/1992 | Ishida ....................... H01P 5/04 |
| | | 324/645 |
| 6,311,638 B1 * | 11/2001 | Ishii ....................... C23C 16/511 |
| | | 118/723 MW |
| 7,127,358 B2 * | 10/2006 | Yue ....................... G05B 13/048 |
| | | 700/32 |
| 7,292,047 B2 * | 11/2007 | Tanaka .............. H01J 37/32935 |
| | | 324/76.19 |

(Continued)

FOREIGN PATENT DOCUMENTS

JP       2018-88323 A    6/2018

*Primary Examiner* — Benjamin Kendall
*Assistant Examiner* — Kurt Sweely
(74) *Attorney, Agent, or Firm* — Studebaker & Brackett PC

(57) ABSTRACT

A controller of a plasma processing apparatus stores a frequency spectrum related to a first timing into a storage unit, controls a microwave generator to generate a microwave in correspondence to a setting frequency, setting power, and a setting bandwidth at a second timing, controls a demodulator to measure travelling wave power and reflected wave power of the microwave for each frequency, calculates the frequency spectrum related to the second timing on the basis of a measurement result from the demodulator, calculates a correction value for correcting a waveform of the travelling wave power for each frequency such that a difference for each frequency between the frequency spectrum related to the second timing and the frequency spectrum related to the first timing, stored in the storage unit, is small, and controls the microwave generator on the basis of the calculated correction value for each frequency.

5 Claims, 13 Drawing Sheets

(56) References Cited

U.S. PATENT DOCUMENTS

| | | | |
|---|---|---|---|
| 10,748,746 B2 * | 8/2020 | Kaneko | H01J 37/32229 |
| 2010/0001744 A1 * | 1/2010 | Hirayama | H05H 1/46 |
| | | | 374/45 |
| 2015/0194292 A1 * | 7/2015 | Kaneko | H01J 37/32201 |
| | | | 156/345.28 |
| 2016/0113103 A1 * | 4/2016 | Van Zyl | H05H 1/46 |
| | | | 315/111.21 |
| 2016/0329194 A1 * | 11/2016 | Dokan | H01J 37/32926 |
| 2018/0151332 A1 | 5/2018 | Kaneko et al. | |

* cited by examiner

APPARATUS FOR PLASMA PROCESSING

CROSS-REFERENCE TO RELATED APPLICATIONS

This application is based on and claims the benefit of priority from Japanese Patent Application No. 2020-083195 filed on May 11, 2020, and the entire contents of which are incorporated herein by reference.

TECHNICAL FIELD

The present disclosure relates to a plasma processing apparatus and a microwave control method.

BACKGROUND

A plasma processing apparatus is used to manufacture electronic devices such as semiconductor devices. The plasma processing apparatus described in Japanese Unexamined Patent Publication No. 2018-88323 excites a gas by using a microwave output from a microwave output unit. The microwave output unit outputs a microwave having power corresponding to setting power while frequency-modulating the microwave in a setting frequency range. The microwave output from the microwave output unit is applied to the antenna of a chamber via a waveguide. The waveguide is provided with a demodulator. The demodulator acquires travelling wave power and reflected wave power of the microwave for each frequency. A calculator calculates a frequency at which a reflection coefficient for each frequency calculated on the basis of the travelling wave power and the reflected wave power is a minimum point as a absorption frequency.

SUMMARY

In an exemplary embodiment of the present disclosure, the plasma processing apparatus that processes a substrate with plasma is provided. The apparatus includes a chamber, a microwave generator, a waveguide, a demodulator, and a controller. The chamber is provided with an antenna and is configured to accommodate the substrate. The microwave generator is configured to generate a microwave having a center frequency, power, and a bandwidth respectively corresponding to a setting frequency, setting power, and a setting bandwidth. The waveguide is configured to guide the microwave output by the microwave generator to the antenna. The demodulator is provided in the waveguide and is configured to measure travelling wave power and reflected wave power of the microwave for each frequency. The controller is connected to the microwave generator and the demodulator and has a storage unit. The controller controls the microwave generator to generate the microwave in correspondence to the setting frequency, the setting power, and the setting bandwidth at a first timing. The controller controls the demodulator to measure the travelling wave power and the reflected wave power of the microwave for each frequency. The controller calculates a frequency spectrum that is a ratio between the travelling wave power and the reflected wave power for each frequency on the basis of a measurement result from the demodulator. The controller stores the frequency spectrum related to the first timing into the storage unit. The controller controls the microwave generator to generate the microwave in correspondence to the setting frequency, the setting power, and the setting bandwidth at a second timing at which time has elapsed from the first timing. The controller controls the demodulator to measure the travelling wave power and the reflected wave power of the microwave for each frequency, and calculates the frequency spectrum related to the second timing on the basis of a measurement result from the demodulator. The controller calculates a correction value for correcting a waveform of the travelling wave power for each frequency such that a difference for each frequency between the frequency spectrum related to the second timing and the frequency spectrum related to the first timing, stored in the storage unit, is small. The controller controls the microwave generator to correct the waveform of the travelling wave power on the basis of the calculated correction value for each frequency.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
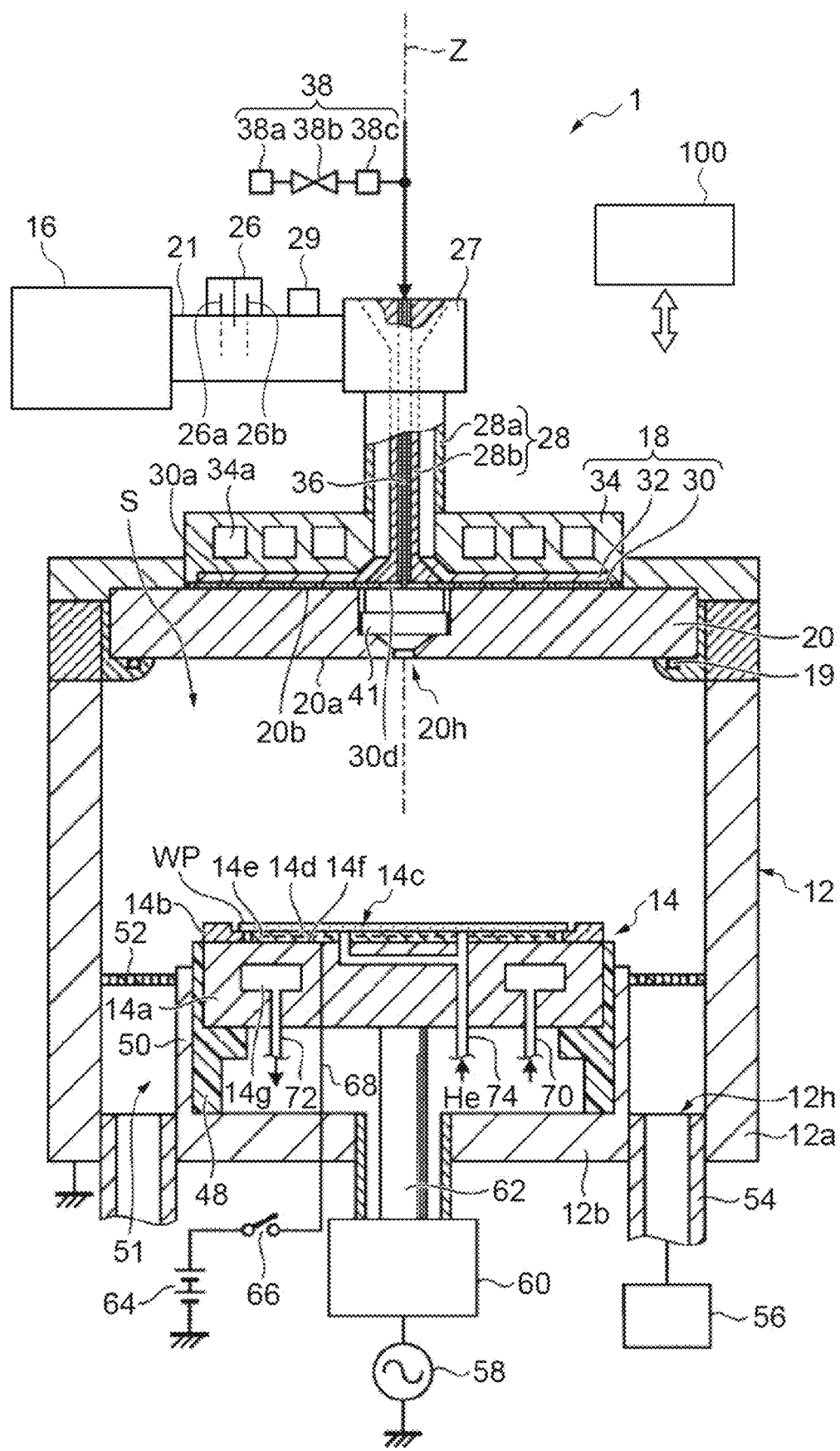
FIG. 1 is a diagram illustrating an example of a plasma processing apparatus according to an exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

Hereinafter, various exemplary embodiments will be described.

In manufacturing of electronic devices, it is important to generate stable plasma according to a process recipe. In order to improve plasma stabilization, it is conceivable to generate plasma with microwave having a bandwidth. However, a plasma state may change over time due to component tolerances or component wear inside a chamber, and thus process characteristics may change.

Thus, it is important to diagnose and monitor a state of a plasma apparatus. The apparatus described in Japanese Unexamined Patent Publication No. 2018-688323 can calculate a absorption frequency. The absorption frequencies may be used to diagnose an apparatus state that causes changes in process characteristics. However, in the plasma processing apparatus described in Japanese Unexamined Patent Publication No. 2018-88323, an absorption frequency is calculated by using a microwave of which a frequency has been swept. Thus, an absorption frequency is calculated by using a diagnosis recipe different from that in a process recipe. Therefore, there is concern that productivity may decrease. Also, a waveform and setting power of a microwave in the diagnosis recipe are different from a waveform and setting power of a microwave in the process recipe. Thus, the diagnosis result in the diagnosis recipe may not always match the diagnosis result when the process recipe is executed.

In view of the above circumstances, a technique capable of calculating an absorption frequency without using a diagnosis recipe is required. A technique capable of reducing a characteristic change in a microwave from a reference apparatus state is required. The present disclosure provides a plasma processing apparatus capable of reducing a characteristic change in a microwave from a reference apparatus state.

In an exemplary embodiment of the present disclosure, the plasma processing apparatus that processes a substrate with plasma is provided. The apparatus includes a chamber, a microwave generator, a waveguide, a demodulator, and a controller. The chamber is provided with an antenna and is configured to accommodate the substrate. The microwave generator is configured to generate a microwave having a center frequency, power, and a bandwidth respectively corresponding to a setting frequency, setting power, and a setting bandwidth. The waveguide is configured to guide the microwave output by the microwave generator to the antenna. The demodulator is provided in the waveguide and is configured to measure travelling wave power and reflected wave power of the microwave for each frequency. The controller is connected to the microwave generator and the demodulator and has a storage unit. The controller controls the microwave generator to generate the microwave in correspondence to the setting frequency, the setting power, and the setting bandwidth at a first timing. The controller controls the demodulator to measure the travelling wave power and the reflected wave power of the microwave for each frequency. The controller calculates a frequency spectrum that is a ratio between the travelling wave power and the reflected wave power for each frequency on the basis of a measurement result from the demodulator. The controller stores the frequency spectrum related to the first timing into the storage unit. The controller controls the microwave generator to generate the microwave in correspondence to the setting frequency, the setting power, and the setting bandwidth at a second timing at which time has elapsed from the first timing. The controller controls the demodulator to measure the travelling wave power and the reflected wave power of the microwave for each frequency, and calculates the frequency spectrum related to the second timing on the basis of a measurement result from the demodulator. The controller calculates a correction value for correcting a waveform of the travelling wave power for each frequency such that a difference for each frequency between the frequency spectrum related to the second timing and the frequency spectrum related to the first timing, stored in the storage unit, is small. The controller controls the microwave generator to correct the waveform of the travelling wave power on the basis of the calculated correction value for each frequency.

According to the apparatus, the microwave is generated in correspondence to the setting frequency, the setting power, and the setting bandwidth at the first timing. The travelling wave power and the reflected wave power of the microwave are measured for each frequency. Consequently, a frequency spectrum is obtained at the first timing. At the second timing at which time has elapsed from the first timing, a microwave is generated under the same conditions, and a frequency spectrum is obtained. A correction value for correcting a waveform of the travelling wave power is calculated for each frequency such that a difference for each frequency between the frequency spectrum related to the second timing and the frequency spectrum related to the first timing stored in the storage unit is small. The waveform of the travelling wave power is corrected on the basis of the calculated correction value for each frequency. As described above, at the second timing, the plasma processing apparatus can correct the waveform of the travelling wave power such that a difference for each frequency between the reference value and the frequency spectrum is small with an apparatus state at the first timing as a reference. Thus, the plasma processing apparatus can reduce a characteristic change in a microwave from the reference apparatus state.

In the exemplary embodiment, the setting frequency, setting power and setting bandwidth may be the same as a setting frequency, setting power, and a setting bandwidth during plasma processing on the substrate. In this case, the plasma processing apparatus may measure a frequency spectrum under the same conditions as during process execution, and correct the frequency spectrum. Therefore, the plasma processing apparatus does not need to prepare a diagnosis recipe separately, and it is possible to minimize a difference between a diagnosis result in the diagnosis recipe and a diagnosis result at the time of executing the process recipe. Since the plasma processing apparatus can perform correction at the time of executing the process recipe, the productivity can be improved compared with a case where the diagnosis recipe is employed.

In the exemplary embodiment, the first timing may be an introduction timing of the apparatus or a maintenance timing of the apparatus. In this case, the plasma processing apparatus may use an apparatus state at the introduction timing or the maintenance timing of the apparatus as a reference.

In another exemplary embodiment of the present disclosure, a microwave control method is provided. The microwave control method includes generating the microwave in correspondence to a setting frequency, setting power, and a setting bandwidth at a first timing; measuring travelling wave power and reflected wave power of the microwave for each frequency, and calculating a frequency spectrum that is a ratio between the travelling wave power and the reflected wave power for each frequency; storing the frequency spectrum related to the first timing; generating the microwave in correspondence to the setting frequency, the setting power, and the setting bandwidth at a second timing at which time has elapsed from the first timing; measuring the travelling wave power and the reflected wave power of the microwave for each frequency, and calculating the frequency spectrum related to the second timing; calculating a correction value for correcting a waveform of the travelling wave power for each frequency such that a difference for each frequency between the frequency spectrum related to the second timing and the frequency spectrum related to the first timing is small; and correcting the waveform of the travelling wave power on the basis of the calculated correction value for each frequency.

According to the microwave control method, similarly to the above plasma processing apparatus, at the second timing, it is possible to correct the waveform of the travelling wave power such that a difference for each frequency between the reference value and the frequency spectrum is small with an apparatus state at the first timing as a reference. Therefore, according to the microwave control method, it is possible to reduce a characteristic change in a microwave from a reference apparatus state.

In still another exemplary embodiment of the present disclosure, a plasma processing apparatus that processes a substrate with plasma is provided. The apparatus includes a chamber, a microwave generator, a waveguide, a demodulator, and a controller. The chamber is provided with an antenna and is configured to accommodate the substrate. The microwave generator is configured to generate a microwave having a center frequency, power, and a bandwidth respectively corresponding to a setting frequency, setting power, and a setting bandwidth. The waveguide is configured to guide the microwave output by the microwave generator to the antenna. The demodulator is provided in the waveguide and is configured to measure travelling wave power and reflected wave power of the microwave for each frequency. The controller is connected to the microwave generator and the demodulator. The controller acquires a reference value corresponding to each of frequencies in a frequency spectrum at the setting frequency, the setting power, and the setting bandwidth. The controller controls the demodulator such that the travelling wave power and the reflected wave power are measured for each frequency. The controller calculates a frequency spectrum that is a ratio between the travelling wave power and the reflected wave power for each frequency. The controller calculates a correction value for correcting a waveform of the travelling wave power of the microwave for each frequency such that a difference for each frequency between the frequency spectrum and the corresponding reference value is small. The controller corrects the waveform of the travelling wave power of the microwave on the basis of the calculated correction value.

According to the apparatus, a reference value corresponding to each of frequencies in a frequency spectrum at the setting frequency, the setting power, and the setting bandwidth is acquired. The microwave is generated in correspondence to the setting frequency, the setting power, and the setting bandwidth. The travelling wave power and the reflected wave power of the microwave are measured for each frequency. Consequently, a frequency spectrum is obtained. A correction value for correcting the waveform of the travelling wave power is calculated for each frequency such that a difference for each frequency between the frequency spectrum and the corresponding reference value is small. The waveform of the travelling wave power is corrected on the basis of the calculated correction value for each frequency. As described above, the plasma processing apparatus can correct the waveform of the travelling wave power such that a difference for each frequency between the reference value and the frequency spectrum is small with the reference value acquired in advance as a reference. Thus, the plasma processing apparatus can reduce a characteristic change in a microwave from the reference apparatus state. The plasma processing apparatus can also reduce an individual difference of apparatuses.

The reference value may be a constant.

In still another exemplary embodiment of the present disclosure, a microwave control method is provided. The microwave control method includes acquiring a reference value that is set to correspond to each frequency in a frequency spectrum, the frequency spectrum being a ratio between travelling wave power and reflected wave power for each frequency of a microwave generated in correspondence to a setting frequency, setting power, and a setting bandwidth; generating the microwave in correspondence to the setting frequency, the setting power, and the setting bandwidth; measuring the travelling wave power and the reflected wave power of the generated microwave for each frequency and calculating the frequency spectrum; calculating a correction value to correct the waveform of the travelling wave power of the microwave for each frequency on the basis of a difference for each frequency between the frequency spectrum and the reference value; and correcting the waveform of the travelling wave power of the microwave on the basis of the calculated correction value for each frequency.

According to the microwave control method, similarly to the above plasma processing apparatus, it is possible to correct the waveform of the travelling wave power such that a difference for each frequency between the reference value and the frequency spectrum is small with the reference value acquired in advance as a reference. Therefore, according to the microwave control method, it is possible to reduce a characteristic change in a microwave from a reference apparatus state.

Hereinafter, various exemplary embodiments will be described in detail with reference to the drawings. The same reference numerals are given to the same or corresponding portions in each drawing.

Outline of Plasma Processing Apparatus

FIG. 1 is a diagram illustrating an example of a plasma processing apparatus according to an exemplary embodiment. As illustrated in FIG. 1, a plasma processing apparatus 1 includes a chamber 12 and a microwave output device 16 (an example of a microwave output unit). The plasma processing apparatus 1 may further include a stage 14, an antenna 18, and a dielectric window 20.

The chamber 12 provides a processing space S at the inside thereof. The chamber 12 includes a side wall 12a and a bottom portion 12b. The side wall 12a is formed in an approximately cylindrical shape. A central axis of the side wall 12a approximately matches an axis Z which extends in a vertical direction. The bottom portion 12b is provided on a lower end side of the side wall 12a. An exhaust hole 12h for exhaust is provided in the bottom portion 12b. The upper end of the side wall 12a is open.

The dielectric window 20 is provided over the upper end of the side wall 12a. The dielectric window 20 includes a lower surface 20a which faces the processing space S. The dielectric window 20 closes the opening in the upper end of the side wall 12a. An O-ring 19 is interposed between the dielectric window 20 and the upper end of the side wall 12a. The chamber 12 is more reliably sealed due to the O-ring 19.

The stage 14 is accommodated in the processing space S. The stage 14 is provided to face the dielectric window 20 in the vertical direction. The stage 14 is provided such that the processing space S is provided between the dielectric window 20 and the stage 14. The stage 14 is configured to support a workpiece WP (for example, a wafer) which is mounted thereon.

In an exemplary embodiment, the stage 14 includes a base 14a and an electrostatic chuck 14c. The base 14a has an approximately disc shape, and is formed from a conductive material such as aluminum. A central axis of the base 14a approximately matches the axis Z. The base 14a is supported by a cylindrical support 48. The cylindrical support 48 is formed from an insulating material, and extends from the bottom portion 12b in a vertically upward direction. A conductive cylindrical support 50 is provided on an outer circumference of the cylindrical support 48. The cylindrical support 50 extends from the bottom portion 12b of the chamber 12 along the outer circumference of the cylindrical support 48 in a vertically upward direction. An annular exhaust path 51 is formed between the cylindrical support 50 and the side wall 12a.

A baffle plate 52 is provided at an upper portion of the exhaust path 51. The baffle plate 52 has an annular shape. A plurality of through-holes, which pass through the baffle plate 52 in a plate thickness direction, are formed in the baffle plate 52. The above-described exhaust hole 12h is provided on a lower side of the baffle plate 52. An exhaust device 56 is connected to the exhaust hole 12h through an exhaust pipe 54. The exhaust device 56 includes an automatic pressure control valve (APC) and a vacuum pump such as a turbo molecular pump. A pressure inside the processing space S may be reduced to a desired vacuum degree by the exhaust device 56.

The base 14a also functions as a radio frequency electrode. A radio frequency power supply 58 for radio frequency bias is electrically connected to the base 14a through a feeding rod 62 and a matching unit 60. The radio frequency power supply 58 outputs a constant frequency which is suitable to control ion energy which is inducted to the workpiece WP, for example, a radio frequency of 13.65 MHz with power which is set. The matching unit 60 accommodates a matcher configured to attain matching between impedance on the radio frequency power supply 58 side, and impedance mainly on a load side such as an electrode, plasma, and the chamber 12. A blocking capacitor for self-bias generation is included in the matcher.

The electrostatic chuck 14c is provided on an upper surface of the base 14a. The electrostatic chuck 14c holds the workpiece WP with an electrostatic suction force. The electrostatic chuck 14c includes an electrode 14d, an insulating film 14e, and an insulating film 14f, and has an approximately disc shape. A central axis of the electrostatic chuck 14c approximately matches the axis Z. The electrode 14d of the electrostatic chuck 14c is configured with a conductive film, and is provided between the insulating film 14e and the insulating film 14f. A DC power supply 64 is electrically connected to the electrode 14d through a switch 66 and a covered wire 68. The electrostatic chuck 14c can suction and hold the workpiece WP by a coulomb's force which is generated by a DC voltage applied from the DC power supply 64. A focus ring 14b is provided on the base 14a. The focus ring 14b is disposed to surround the workpiece WP and the electrostatic chuck 14c.

A coolant chamber 14g is provided at the inside of the base 14a. For example, the coolant chamber 14g is formed to extend around the axis Z. A coolant is supplied into the coolant chamber 14g from a chiller unit through a pipe 70. The coolant, which is supplied into the coolant chamber 14g, returns to the chiller unit through a pipe 72. A temperature of the coolant is controlled by the chiller unit, and thus a temperature of the electrostatic chuck 14c and a temperature of the workpiece WP are controlled.

A gas supply line 74 is formed in the stage 14. The gas supply line 74 is provided to supply a heat transfer gas, for example, a He gas to a space between an upper surface of the electrostatic chuck 14c and a rear surface of the workpiece WP.

The microwave output device 16 outputs a microwave which excites a process gas supplied into the chamber 12. The microwave output device 16 is configured to variably adjust a frequency, power, and a bandwidth of the microwave. In an example, the microwave output device 16 may adjust the power of the microwave in a range of 0 W to 5000 W. The microwave output device 16 may adjust the frequency of the microwave in a range of 2400 MHz to 2500 MHz. The microwave output device 16 may adjust the bandwidth of the microwave in a range of 0 MHz to 100 MHz.

The plasma processing apparatus 1 further includes a waveguide 21, a tuner 26, a mode converter 27, and a coaxial waveguide 28. An output unit of the microwave output device 16 is connected to one end of the waveguide 21. The other end of the waveguide 21 is connected to the mode converter 27. That is, the waveguide 21 is configured as a conduit for guiding the microwave output by the microwave output device 16 to the antenna 18 of the chamber 12 that will be described later. For example, the waveguide 21 is a rectangular waveguide. The tuner 26 is provided in the waveguide 21. The tuner 26 has a movable plate 26a and a movable plate 26b as an example. Each of the movable plates 26a and 26b is configured to adjust a protrusion amount thereof with respect to an inner space of the waveguide 21. The tuner 26 adjusts a protrusion position of each of the movable plates 26a and 26b with respect to a reference position such that impedance of the microwave output device 16 (impedance on the microwave output unit side) with impedance of a load match each other. For example, the tuner 26 adjusts the position of the movable plate such that the impedance of the microwave output device 16 and the impedance of the chamber 12 (impedance on the antenna side) match each other.

The mode converter 27 converts a mode of the microwave transmitted from the waveguide 21, and supplies the microwave having undergone mode conversion to the coaxial waveguide 28. The coaxial waveguide 28 includes an outer conductor 28a and an inner conductor 28b. The outer conductor 28a has an approximately cylindrical shape, and a central axis thereof approximately matches the axis Z. The inner conductor 28b has an approximately cylindrical shape, and extends on an inner side of the outer conductor 28a. A central axis of the inner conductor 28b approximately matches the axis Z. The coaxial waveguide 28 transmits the microwave from the mode converter 27 to the antenna 18.

The antenna 18 is provided on a surface 20b of the dielectric window 20 on an opposite side to the lower surface 20a. The antenna 18 includes a slot plate 30, a dielectric plate 32, and a cooling jacket 34.

The slot plate 30 is provided on the surface 20b of the dielectric window 20. The slot plate 30 is formed from a conductive metal, and has an approximately disc shape. A central axis of the slot plate 30 approximately matches the axis Z. The slot plate 30 is provided with a plurality of slot holes 30a. The plurality of slot holes 30a configure a plurality of slot pairs in an example. Each of the plurality of slot pairs includes two slot holes 30a that extend in directions intersecting each other and have a substantially long hole shape. The plurality of slot pairs are arranged along one or more concentric circles around the axis Z. In addition, a through-hole 30d through which a conduit 36 that will be described later is passable is provided in the central portion of the slot plate 30.

The dielectric plate 32 is formed on the slot plate 30. The dielectric plate 32 is formed from a dielectric material such as quartz, and has an approximately disc shape. A central axis of the dielectric plate 32 approximately matches the axis Z. The cooling jacket 34 is provided on the dielectric plate 32. The dielectric plate 32 is provided between the cooling jacket 34 and the slot plate 30.

A surface of the cooling jacket 34 is conductive. A flow passage 34a is formed at the inside of the cooling jacket 34. A coolant is supplied to the flow passage 34a. A lower end of the outer conductor 28a is electrically connected to an upper surface of the cooling jacket 34. A lower end of the inner conductor 28b passes through a hole formed in a central portion of the cooling jacket 34 and the dielectric plate 32 and is electrically connected to the slot plate 30.

A microwave from the coaxial waveguide 28 propagates through the inside of the dielectric plate 32 and is supplied to the dielectric window 20 from the plurality of slot holes 30a of the slot plate 30. The microwave, which is supplied to the dielectric window 20, is introduced into the processing space S.

The conduit 36 passes through an inner hole of the inner conductor 28b of the coaxial waveguide 28. As described above, the through-hole 30d through which the conduit 36 is passable is provided in the central portion of the slot plate 30. The conduit 36 extends to pass through the inner hole of the inner conductor 28b, and is connected to a gas supply system 38.

The gas supply system 38 supplies a process gas for processing the workpiece WP to the conduit 36. The gas supply system 38 may include a gas source 38a, a valve 38b, and a flow rate controller 38c. The gas source 38a is a gas source of the process gas. The valve 38b switches supply and supply stoppage of the process gas from the gas source 38a. For example, the flow rate controller 38c is a mass flow controller, and adjusts a flow rate of the process gas from the gas source 38a.

The plasma processing apparatus 1 may further include an injector 41. The injector 41 supplies a gas from the conduit 36 to a through-hole 20h which is formed in the dielectric window 20. The gas, which is supplied to the through-hole 20h of the dielectric window 20, is supplied to the processing space S. The process gas is excited by a microwave which is introduced into the processing space S from the dielectric window 20. According to this, plasma is generated in the processing space S, and the workpiece WP is processed by active species such as ions and/or radicals from the plasma.

The plasma processing apparatus 1 further includes a controller 100. The controller 100 collectively controls respective units of the plasma processing apparatus 1. The controller 100 may include a processor such as a CPU, a user interface, and a storage unit.

The processor executes a program and a process recipe which are stored in the storage unit so as to collectively control respective units such as the microwave output device 16, the stage 14, the gas supply system 38, and the exhaust device 56.

The user interface includes, for example, a keyboard or a touch panel with which a process manager performs a command input operation and the like so as to manage the plasma processing apparatus 1, and a display that visually displays an operation status or the like of the plasma processing apparatus 1.

The storage unit stores, for example, control programs (software) for realizing various processes executed by the plasma processing apparatus 1 under the control of the processor, and a process recipe including process condition data and the like. The processor calls various control programs from the storage unit and executes the control programs in accordance with necessity such as an instruction from the user interface. A desired process is executed in the plasma processing apparatus 1 under the control of the processor.

Configuration Examples of Microwave Output Device, Tuner, and Demodulator

Figure 2:
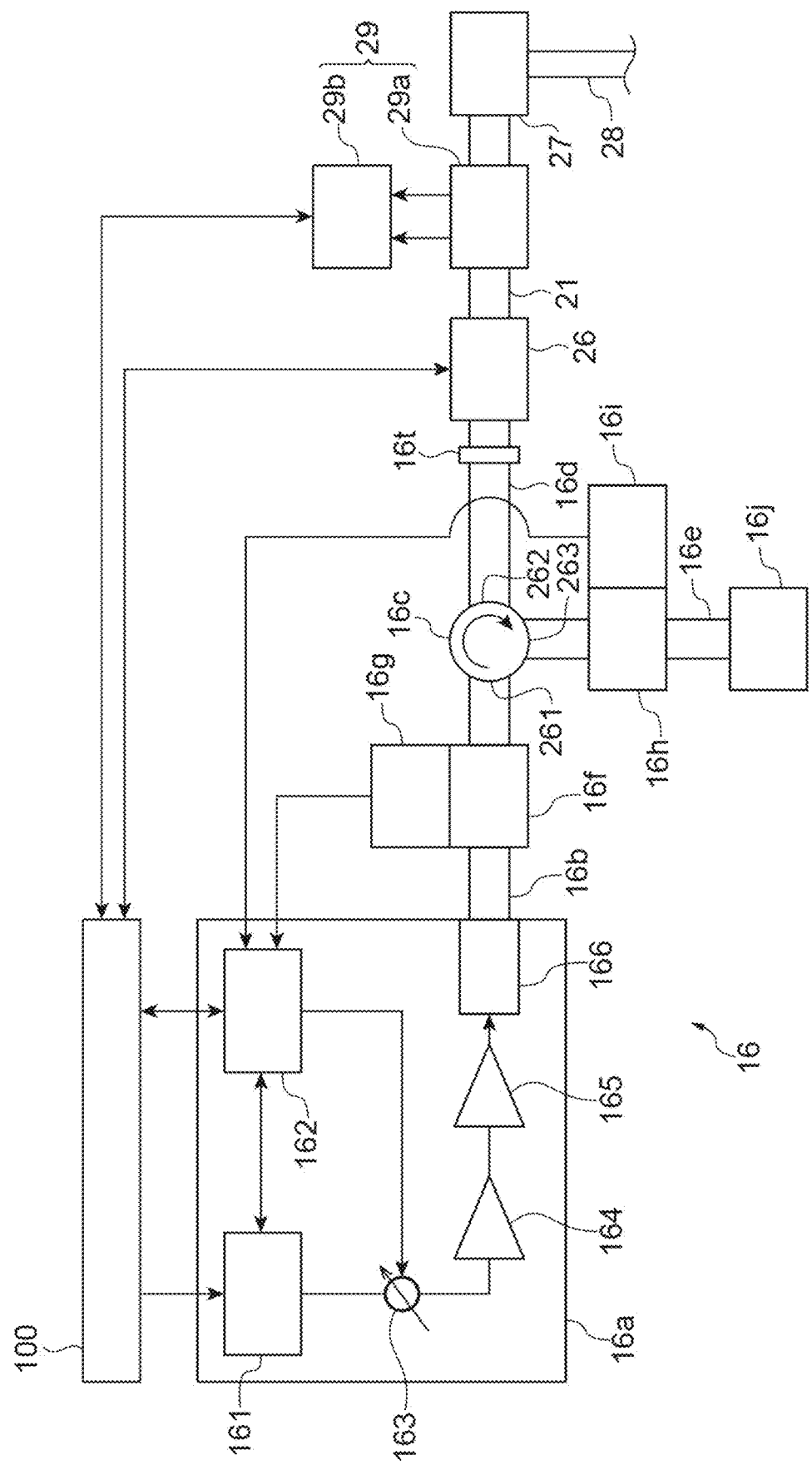
FIG. 2 is a diagram illustrating examples of a microwave output device, a tuner, and a demodulator.

Hereinafter, details of the microwave output device 16, the tuner 26, and the demodulator 29 will be described. FIG. 2 is a diagram illustrating examples of the microwave output device 16, the tuner 26, and the demodulator 29. The microwave output device 16 includes a microwave generator 16a, a waveguide 16b, a circulator 16c, a waveguide 16d, a waveguide 16e, a first directional coupler 16f, a first measurement unit 16g, a second directional coupler 16h, a second measurement unit 16i, and a dummy load 16j.

The microwave generator 16a includes a waveform generation unit 161, a power controller 162, an attenuator 163, an amplifier 164, an amplifier 165, and a mode converter 166.

The waveform generation unit 161 generates a microwave. The waveform generation unit 161 generates a microwave having a center frequency, power, and a bandwidth respectively corresponding to a setting frequency, setting power, and a setting bandwidth. As an example, the waveform generation unit 161 generates a microwave according to a setting frequency, setting power, and a setting bandwidth designated by the controller 100.

Figure 3:
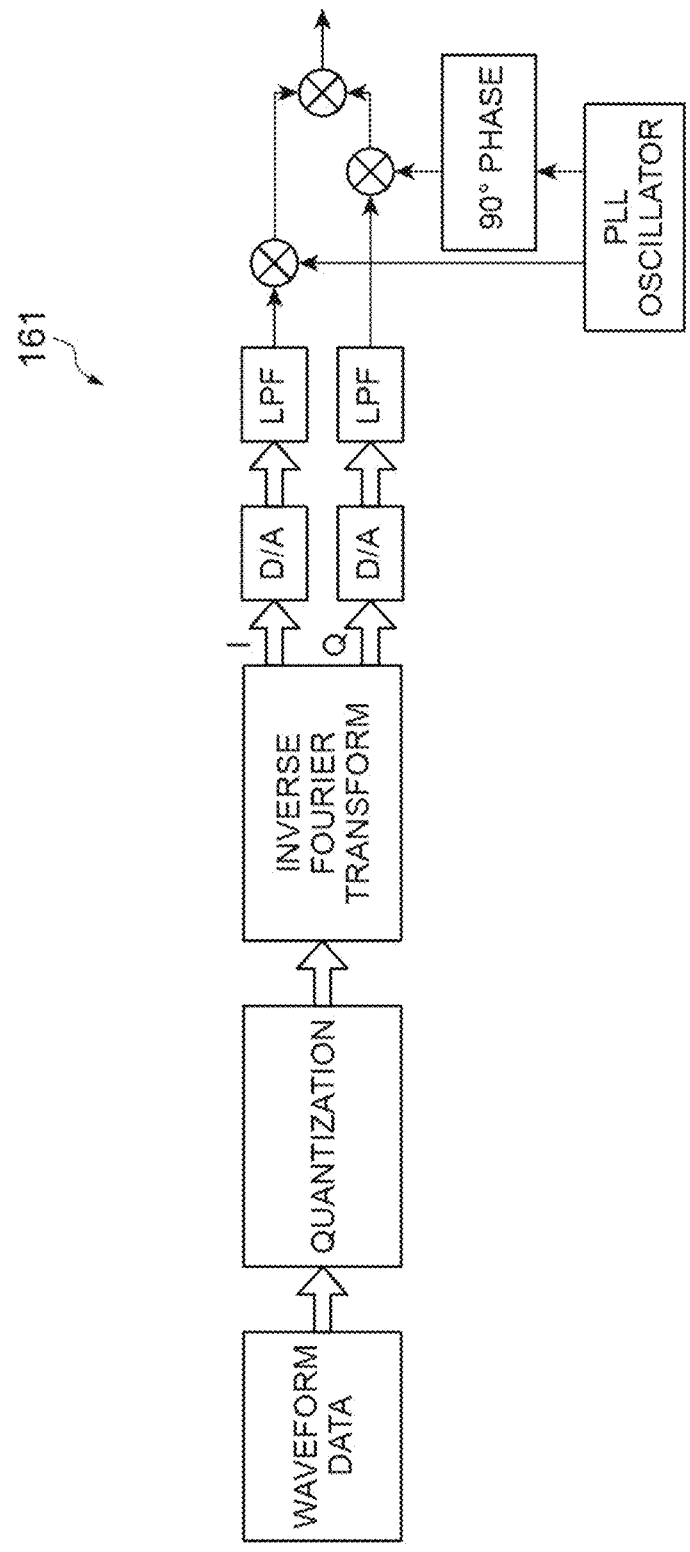
FIG. 3 is a diagram illustrating an example of a microwave generation principle in a waveform generation unit.

FIG. 3 is a diagram illustrating an example of a microwave generation principle in the waveform generation unit. The waveform generation unit 161 includes, for example, a phase locked loop (PLL) oscillator that is a radio frequency oscillator and an IQ digital modulator connected to the PLL oscillator. The waveform generation unit 161 sets a frequency of a microwave oscillating from the PLL oscillator to a frequency within a setting frequency range designated by the controller 100. The waveform generation unit 161 modulates the microwave from the PLL oscillator and a microwave having a phase difference of 90° with the microwave front the PLL oscillator by using the IQ digital modulator. Consequently, the waveform generation unit 161 generates a microwave having a frequency within the setting frequency range.

The waveform generation unit 161 inputs, for example, N types of waveform data in a bandwidth of a frequency spectrum, and performs quantization and inverse Fourier transform to generate a microwave having a plurality of frequency components or a single frequency in the bandwidth.

In an example, the waveform generation unit 161 has waveform data represented by a digitalized code sequence in advance. The waveform generation unit 161 quantizes the waveform data and applies inverse Fourier transform to the quantized data to generate in-phase data (I data) and quadrature data (Q data). The waveform generation unit 161 applies digital/analog (D/A) conversion to each of the I data and the Q data to obtain two analog signals. The waveform generation unit 161 inputs the analog signals to a low-pass filter (LPF) through which only a low frequency component passes. The waveform generation unit 161 mixes the two analog signals output from the LPF with the microwave from the PLL oscillator and the microwave having a phase difference of 90° with the microwave from the PLL oscillator, respectively. The waveform generation unit 161 combines microwaves generated through the mixing with each other. Consequently, the waveform generation unit 161 generates a microwave having a plurality of frequency components or a microwave having a single frequency in a bandwidth.

The waveform generation unit 161 is not limited to a waveform generation unit using the IQ modulation described above. The waveform generation unit 161 may be a waveform generation unit using a direct digital synthesizer (DDS) and a voltage controlled oscillator (VCO).

Figure 4:
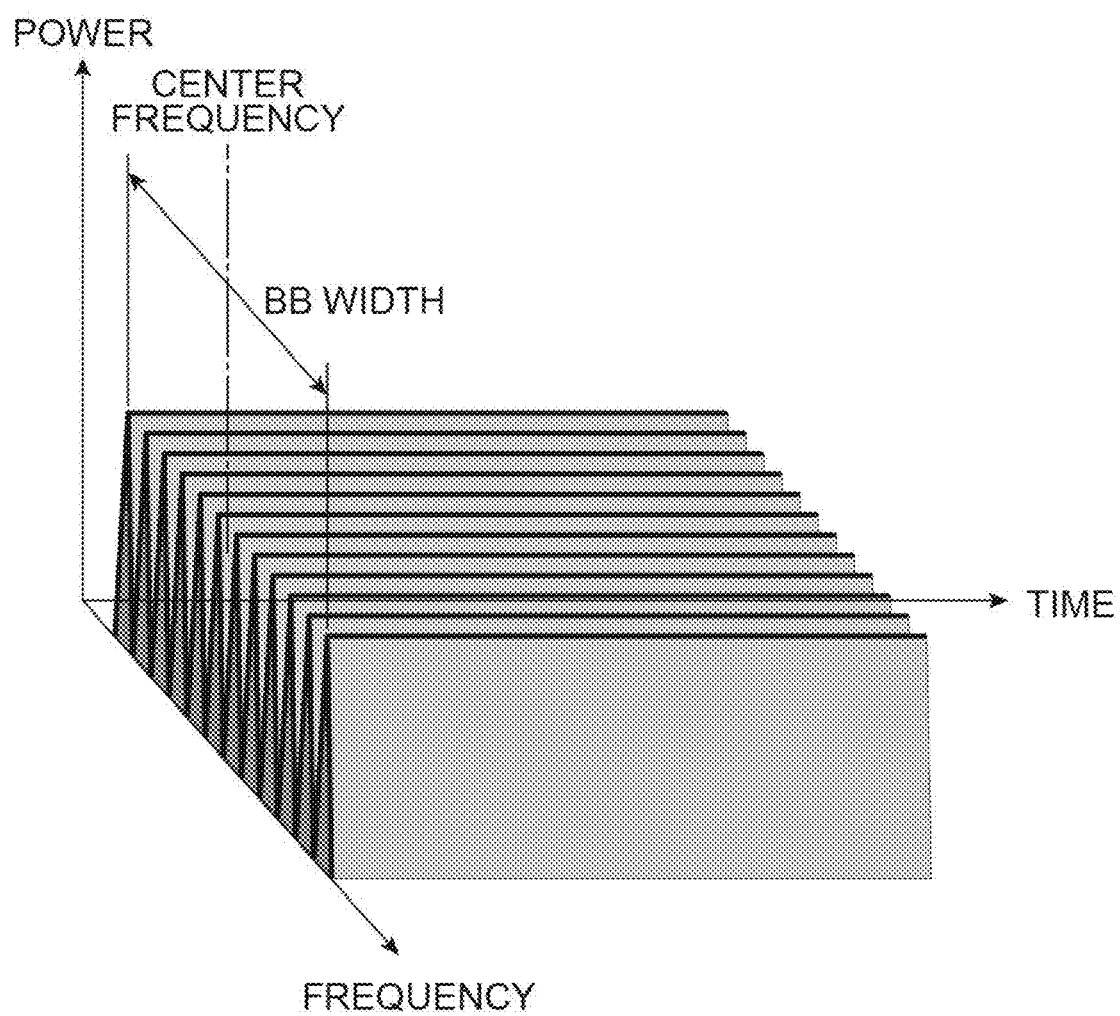
FIG. 4 is a diagram illustrating an example of a microwave having a bandwidth.

FIG. 4 is a diagram illustrating an example of a microwave having a bandwidth. As illustrated in FIG. 4, the microwave has a center frequency and a bandwidth (BB width) respectively corresponding to a setting frequency and a setting bandwidth for which instructions are given by the controller 100. A setting frequency range is determined on the basis of the center frequency and bandwidth.

Referring to FIG. 2, an output of the waveform generation unit 161 is connected to the attenuator 163. The attenuator 163 is connected to the power controller 162. The power controller 162 may be, for example, a processor. The power controller 162 controls an attenuation rate of the microwave in the attenuator 163 such that the microwave having the power corresponding to the setting power designated by the controller 100 is output from the microwave output device 16. An output of the attenuator 163 is connected to the mode converter 166 via the amplifier 164 and the amplifier 165. Each of the amplifier 164 and the amplifier 165 amplifies the microwave at a predetermined amplification rate. The mode converter 166 converts a mode of the microwave output from the amplifier 165. A microwave that is generated through the mode conversion in the mode converter 166 is output as an output microwave of the microwave generator 16a.

An output of the microwave generator 16a is connected to one end of the waveguide 16b. The other end of the waveguide 16b is connected to a first port 261 of the circulator 16c. The circulator 16c includes a first port 261, a second port 262, and a third port 263. The circulator 16c outputs a microwave, which is input to the first port 261, from the second port 262, and outputs a microwave, which is input to the second port 262, from the third port 263. One end of the waveguide 16d is connected to the second port 262 of the circulator 16c. The other end of the waveguide 16d is an output unit 16t of the microwave output device 16.

One end of the waveguide 16e is connected to the third port 263 of the circulator 16c. The other end of the waveguide 16e is connected to the dummy load 16j. The dummy load 16j receives a microwave which propagates through the waveguide 16e and absorbs the microwave. For example, the dummy load 16j converts the microwave into heat.

The first directional coupler 16f is configured to branch parts of microwaves (that is, travelling waves) which are output from the microwave generator 16a and propagate to the output unit 16t, and to output the parts of the travelling waves. The first measurement unit 16g determines a first measured value indicating power of the travelling waves in the output unit 16t on the basis of the parts of the travelling waves output from the first directional coupler 16f.

The second directional coupler 16h is configured to branch parts of microwaves (that is, reflected waves) returned to the output unit 16t and to output the parts of the reflected waves. The second measurement unit 16i determines a second measured value indicating power of the reflected waves in the output unit 16t on the basis of the parts of the reflected waves output from the second directional coupler 16h.

The first measurement unit 16g and the second measurement unit 16i are connected to the power controller 162. The first measurement unit 16g outputs the first measured value to the power controller 162, and the second measurement unit 16i outputs the second measured value to the power controller 162. The power controller 162 controls the attenuator 163 such that a difference between the first measured value and the second measured value, that is, load power matches the setting power designated by the controller 100, and controls the waveform generation unit 161 as necessary.

The first directional coupler 16f is provided between one end and the other end of the waveguide 16b. The second directional coupler 16h is provided between one end and the other end of the waveguide 16e. The first directional coupler 16f may be provided between one end and the other end of the waveguide 16d, or both the first directional coupler 16f and the second directional coupler 16h may be provided between one end and the other end of the waveguide 16d.

The tuner 26 is provided in the waveguide 21. The tuner 26 adjusts protrusion positions of the movable plates such that impedance on the microwave output device 16 side matches impedance on the antenna 18 side on the basis of a signal from the controller 100. The tuner 26 causes a driver circuit and an actuator (not illustrated) to operate the movable plates. The protrusion positions of the movable plates may be adjusted by using a stub structure.

The demodulator 29 is provided between the tuner 26 and the antenna 18 in the waveguide 21, for example. The demodulator 29 acquires travelling wave power that is power of the travelling wave travelling in the waveguide 21 and reflected wave power that is power of the reflected wave from the antenna 18 side, for each frequency. The demodulator 29 may be provided between the circulator 16c (second port 262) and the tuner 26 in the waveguide 21.

The demodulator 29 has a directional coupler 29a and a demodulation controller 29b. The directional coupler 29a is a bidirectional coupler having four ports. The directional coupler 29a is configured to branch parts of microwaves (that is, travelling waves) which are output from the microwave generator 16a and propagate through the waveguide 21, and to output the parts of the travelling waves. Similarly, the directional coupler 29a is configured to branch parts of microwaves (that is, reflected waves) returning from the mode converter 27 and to output the parts of the reflected waves.

The demodulation controller 29b is a calculator having a processor and a memory. The demodulation controller 29b measures travelling wave power Pf in the directional coupler 29a on the basis of the parts of the travelling waves output from the directional coupler 29a. Similarly, the demodulation controller 29b measures reflected wave power Pr in the directional coupler 29a on the basis of the parts of the reflected waves output from the directional coupler 29a.

Hereinafter, two configuration examples of the demodulation controller 29b will be described.

Demodulation Controller 29b of First Example

Figure 5:
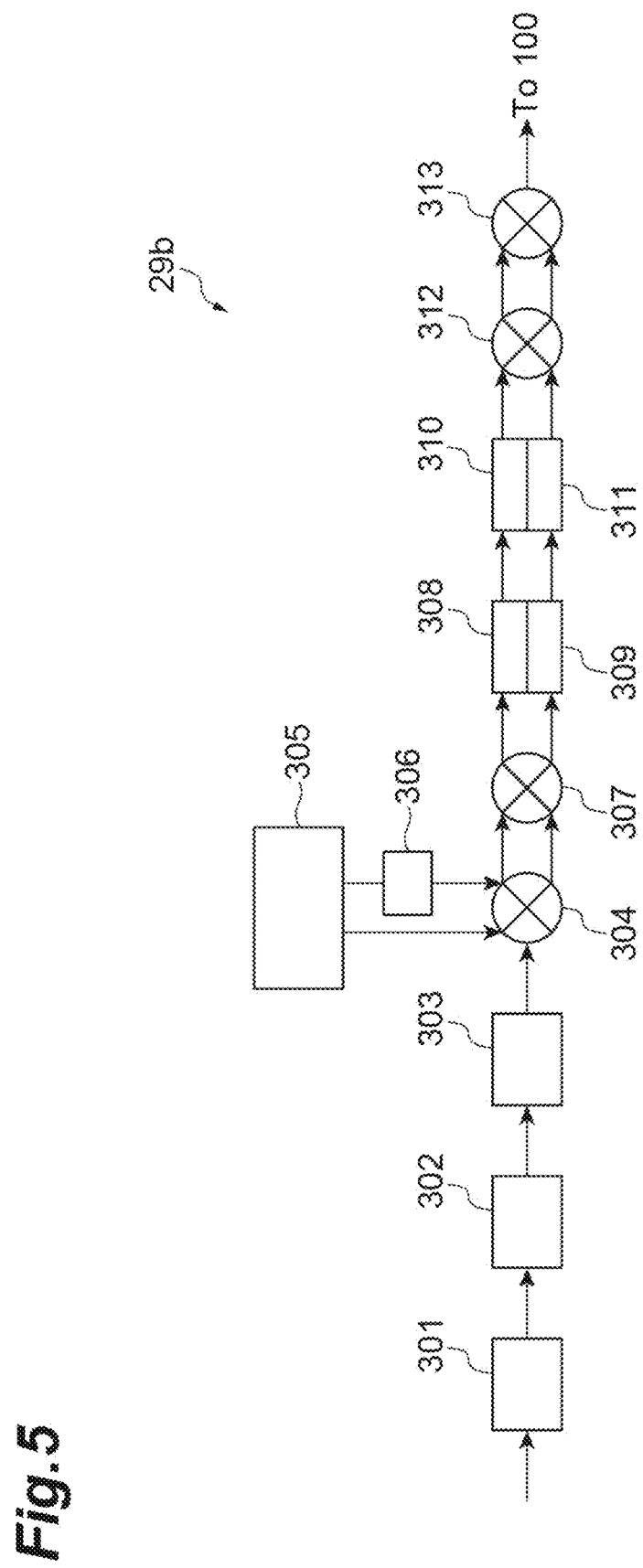
FIG. 5 is a configuration diagram of a demodulation controller of a first example.

FIG. 5 is a configuration diagram of the demodulation controller 29b of a first example. The demodulation controller 29b of the first example performs IQ demodulation. As illustrated in FIG. 5, the demodulation controller 29b of the first example includes an attenuator 301, an RF switch 302, a bandpass filter 303, a mixer 304, a PLL oscillator 305, a frequency shifter 306, a mixer 307, and low-pass filters 308 and 309, A/D converters 310 and 311, and a mixer 312 (for fast Fourier transform (FFT)), and a mixer 313 (for parallel-serial conversion).

The attenuator 301, the RF switch 302, the bandpass filter 303, the mixer 304, the PLL oscillator 305, the frequency shifter 306, the mixer 307, the low-pass filters 308 and 309, the A/D converters 310 and 311, and the mixers 312 and 313 configure a first spectrum analysis unit. The first spectrum analysis unit calculates digital values Pf(f) and Pr(f) respectively corresponding to the above-described travelling wave power and reflected wave power.

A part of a travelling wave or a part of a reflected wave output from the directional coupler 29a is input to an input of the attenuator 301. An analog signal attenuated by the attenuator 301 is filtered into a predetermined signal by the RF switch 302 and the bandpass filter 303. The filtered signal is mixed by the mixers 304 and 307 by using a microwave from the PLL oscillator 305 and a microwave having a phase difference of 90° given by the frequency shifter 306, to be modulated into an I signal and a Q signal. The I signal and the Q signal are respectively filtered by the low-pass filters 308 and 309, and are respectively changed to digital signals by the A/D converters 310 and 311. The digitally converted I signal and Q signal are subjected to discrete fast Fourier transform in the mixer 312, and parallel-serial converted digital values Pf(f) and Pr(f) in the mixer 313 are output. The digital values Pf(f) and Pr(f) represent the travelling wave power Pf and the reflected wave power Pr correlated with a frequency f. The travelling wave power or the reflected wave power correlated with the frequency is output to the controller 100.

Demodulation Controller 29b of Second Example

Figure 6:
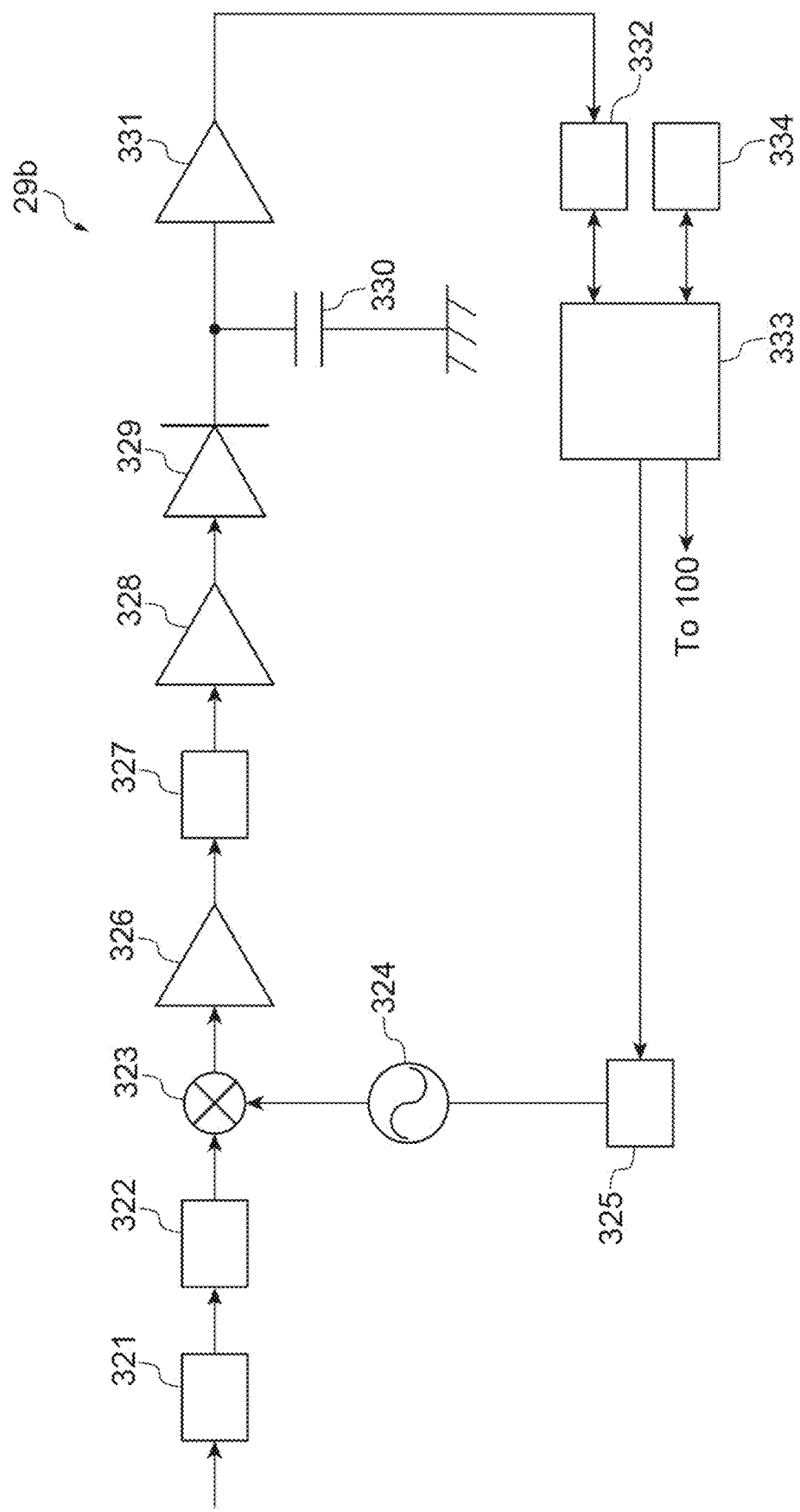
FIG. 6 is a configuration diagram of a demodulation controller of a second example.

FIG. 6 is a configuration diagram of the demodulation controller 29b of a second example. The demodulation controller 29b of the second example performs demodulation according to a superheterodyne method. As illustrated in FIG. 6, the demodulation controller 29b of the second example includes an attenuator 321, a low-pass filter 322, a mixer 323, a local oscillator 324, a frequency sweep controller 325, an IF amplifier 326 (intermediate frequency amplifier), an IF filter 327 (intermediate frequency filter), a log amplifier 328, a diode 329, a capacitor 330, a buffer amplifier 331, an A/D converter 332, and a second processing unit 333.

The attenuator 321, the low-pass filter 322, the mixer 323, the local oscillator 324, the frequency sweep controller 325, the IF amplifier 326, the IF filter 327, the log amplifier 328, the diode 329, the capacitor 330, the buffer amplifier 331, and the A/D converter 332 configure a second spectrum analysis unit. The second spectrum analysis unit calculates digital values Pf(f) and Pr(f) respectively corresponding to the above-described travelling wave power and reflected wave power.

A part of a travelling wave or a part of a reflected wave output from the directional coupler 29a is input to an input of the attenuator 321. An analog signal attenuated by the attenuator 321 is filtered by the low-pass filter 322. The signal filtered by the low-pass filter 322 is input to the mixer 323. On the other hand, the local oscillator 324 changes a frequency of a signal to be transmitted under the control of the frequency sweep controller 325 in order to convert a frequency component in a bandwidth of a part of the travelling wave or a part of the reflected wave input to the attenuator 321 into a signal having a predetermined frequency. The mixer 323 generates a signal having a predetermined frequency by mixing the signal from the low-pass filter 322 with the signal from the local oscillator 324.

The signal from the mixer 323 is amplified by the IF amplifier 326, and the signal amplified by the IF amplifier 326 is filtered by the IF filter 327. The signal filtered by the IF filter 327 is amplified by the log amplifier 328. The signal amplified by the log amplifier 328 is changed to an analog signal (voltage signal) through rectification in the diode 329, smoothing in the capacitor 330, and amplification in the buffer amplifier 331. The analog signal from the buffer amplifier 331 is changed to the digital value Pf(f) or the digital value Pr(f) by the A/D converter 332. This digital value represents the travelling wave power or the reflected wave power. The digital value calculated by the second spectrum analysis unit is input to the second processing unit 333.

The second processing unit 333 is configured with a processor such as a CPU. A storage device 334 is connected to the second processing unit 333. In an example, the storage device 334 stores a second correction coefficient that is preset in association with a frequency. A plurality of second correction coefficients are coefficients for correcting the digital value Pf(f) or the digital value Pr(f) to the travelling wave power or the reflected wave power. The second processing unit 333 outputs the travelling wave power or the reflected wave power correlated with the frequency to the controller 100.

As will be described later, in a case where an absorption frequency is calculated from the minimum value of the reflected wave power, the demodulator 29 may be configured to acquire only the reflected wave power. In this case, the directional coupler 29a is a unidirectional coupler that branches only the reflected wave, such as the second directional coupler 16h, and the demodulation controller 29b measures only the reflected wave power Pr.

Functional Configuration of Controller

Figure 7:
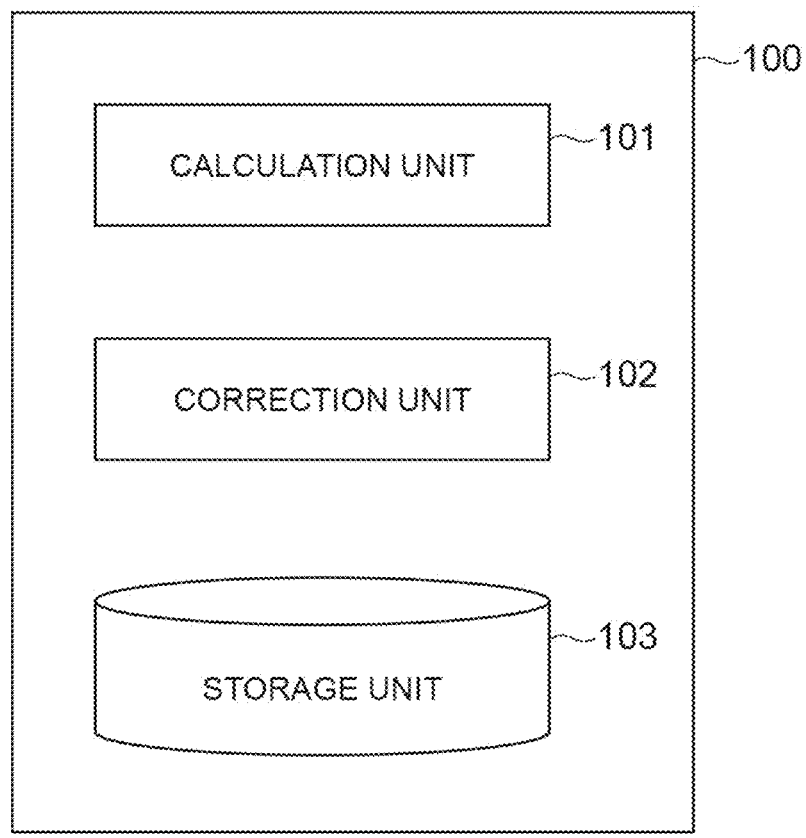
FIG. 7 is a block diagram illustrating examples of functions of a controller.

FIG. 7 is a block diagram illustrating an example of the function of the controller 100. As illustrated in FIG. 7, the controller 100 has at least a calculation unit 101, a correction unit 102, and a storage unit 103 in addition to the function of controlling the microwave generator 16a and the demodulator 29. The calculation unit 101 calculates a frequency spectrum on the basis of a measurement result from the demodulator. The frequency spectrum is a ratio between the travelling wave power and the reflected wave power for each frequency. This ratio is obtained, for example, by dividing the reflected wave power by the travelling wave power. Hereinafter, the ratio will be also referred to as a Pr/Pf ratio. The frequency spectrum is obtained by plotting a frequency in a setting frequency range on a transverse axis and plotting the Pr/Pf ratio on a longitudinal axis. The correction unit 102 corrects a waveform of the travelling wave power in order to change a shape of the frequency spectrum. For example, a correction value is prepared for each frequency, and a shape of the waveform data input to the waveform generation unit 161 is changed by using the correction value. That is, the shape of the frequency spectrum can be changed by adjusting the waveform of the travelling wave power (power value for each frequency).

The correction unit 102 calculates a correction value for each frequency on the basis of the reference value. The correction unit 102 calculates the correction value such that a difference between the reference value and the measurement result is small. The reference value is a frequency spectrum acquired under the same setting frequency, setting power, and setting bandwidth conditions as at the time of measurement. That is, the reference value is set for each frequency.

As an example, the reference value may be a frequency spectrum measured in the same apparatus under the same setting frequency, setting power, and setting bandwidth conditions as at the time of measurement in the past. An example in the past is an introduction timing of the apparatus or a maintenance timing of the apparatus. In this case, the controller 100 stores the measured frequency spectrum into the storage unit 103. The controller 100 may acquire a reference value by referring to the storage unit 103 and calculate a correction value for each frequency. In this case, the past plasma state can be reproduced even if a plasma state changes over time due to a change in the component tolerance or the degree of wear inside the chamber.

As an example, the reference value may be a frequency spectrum measured in another apparatus under the same setting frequency, setting power, and setting bandwidth conditions as at the time of measurement in the past. In this case, the controller 100 acquires the frequency spectrum from another apparatus and stores the frequency spectrum into the storage unit 103. The controller 100 may acquire a reference value by referring to the storage unit 103 and calculate a correction value for each frequency. In this case, since a plasma state in another apparatus can be reproduced, a variation in a plasma state based on an individual difference of apparatuses can be reduced.

As an example, the reference value may be a value set for each frequency instead of a measured value. For example, the reference value can be a constant value (constant) regardless of the frequency. In this case, the controller 100 stores the acquired constant into the storage unit 103. Even in this case, since all the apparatuses are corrected on the basis of the same reference, it is possible to reduce a variation in a plasma state based on an individual difference of the apparatuses.

In a case where the reference value is obtained through measurement, a setting frequency, setting power, and a setting bandwidth at the time of measurement of the reference value may the same as a setting frequency, setting power, and a setting bandwidth for which instructions for are given in a process recipe for processing a substrate. In this case, correction can be performed without stopping an actual process.

Figure 8A:
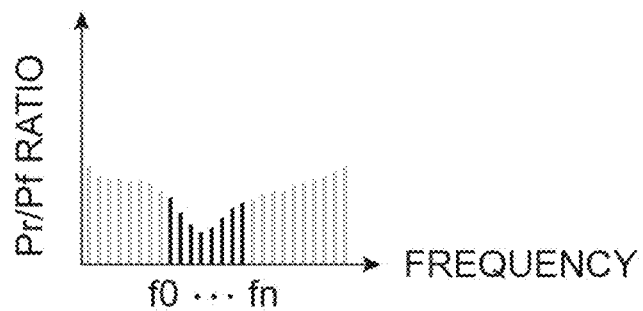
FIGS. 8A to 8D are diagrams illustrating examples of changes in a frequency spectrum.

FIGS. 8A to 8D are diagrams for explaining changes in a frequency spectrum. FIG. 8A illustrates a frequency spectrum in an initial state. The transverse axis represents a frequency, and the longitudinal axis represents the Pr/Pf ratio. A range from f0 to fn in FIG. 8A is a bandwidth of the frequency spectrum. The range from f0 to fn is a setting frequency.

Figure 8B:
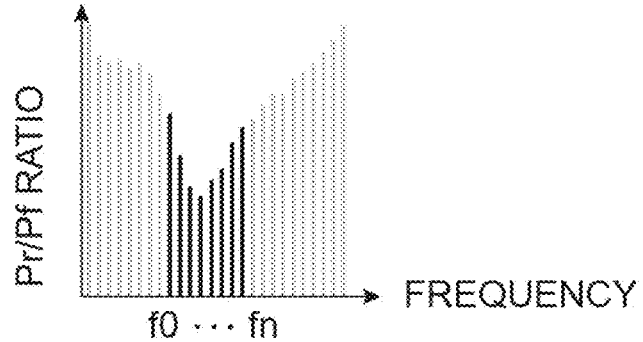
Figure 8C:
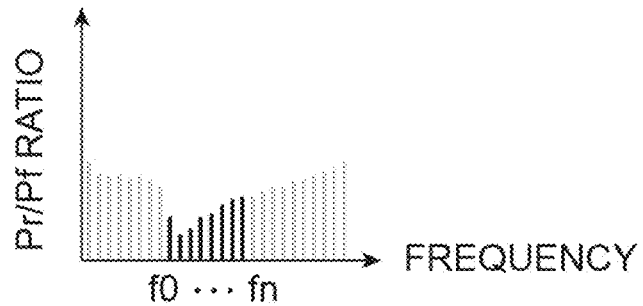
Figure 8D:
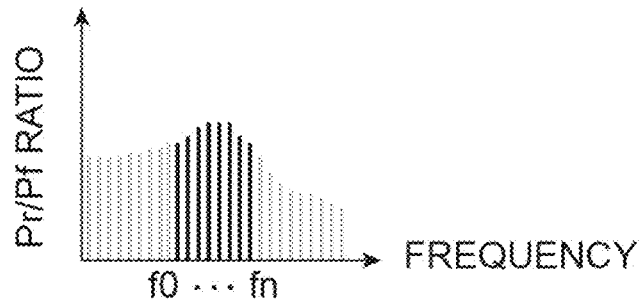

FIGS. 8B to 8D are frequency spectra acquired at a timing at which time has elapsed from the acquisition timing of the frequency spectrum illustrated in FIG. 8A. The transverse axis represents a frequency, and the longitudinal axis represents the Pr/Pf ratio. A range from f0 to fn in FIGS. 8B to 8D is a bandwidth of the frequency spectrum. The range from f0 to fn is a setting frequency. As illustrated in FIGS. 8B to 8D, frequency spectra of the acquired frequency change due to the influence of the time-dependent change of the apparatus. For example, as illustrated in FIG. 8B, the Pr/Pf ratio increases. Such an increasing change in the Pr/Pf ratio suggests that microwaves do not match each other. Alternatively, a frequency at which the minimum value is obtained may change as illustrated in FIG. 8C, or a spectral shape may change as illustrated in FIG. 8D. Such a change in the minimum peak or a change in the spectral shape suggests that a component abnormality or component wear occurs. In a case where the problem suggesting the occurrence can be solved through correction, the controller 100 may correct a waveform of the travelling wave power such that the frequency spectrum is within an allowable range.

Microwave Control Method Corresponding to Change Over Time of Apparatus

Figure 9:
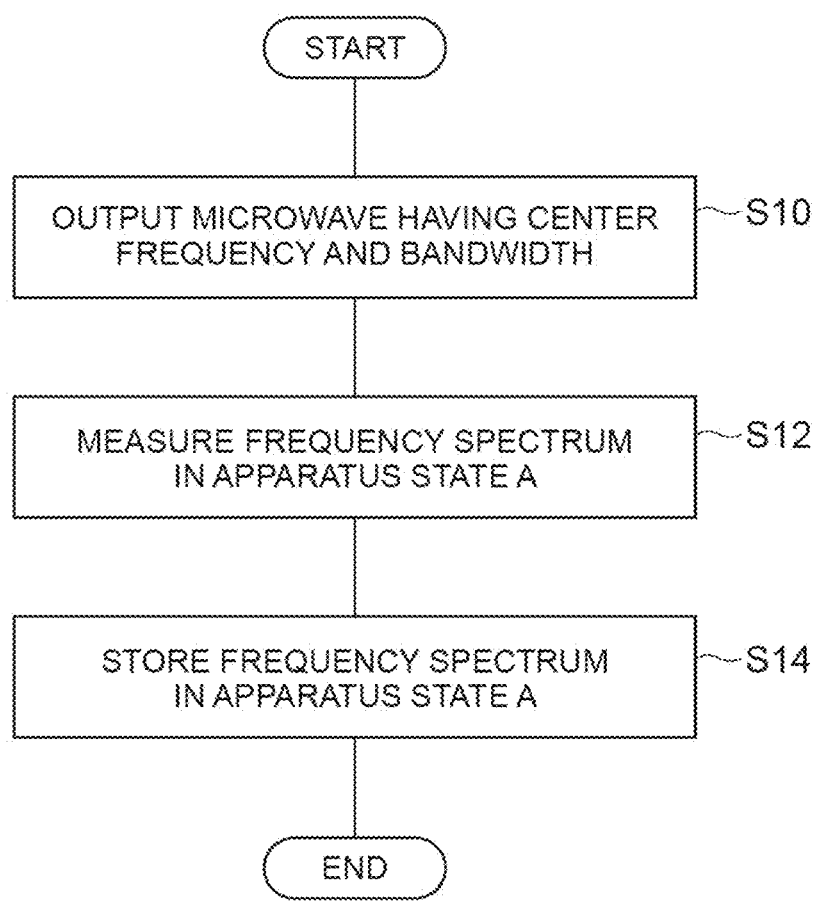
FIG. 9 is a flowchart illustrating an example of a microwave control method.

FIG. 9 is a flowchart illustrating an example of a microwave control method. The flowchart of FIG. 9 is executed by the controller 100. An execution time is a first timing, which is earlier than a second timing that will be described later. The execution time may be an introduction timing of the apparatus or a maintenance timing of the apparatus. The flowchart of FIG. 9 illustrates an operation when a reference value is acquired in the same apparatus. Hereinafter, an apparatus state at the first timing will be referred to as apparatus state A.

First, in step S10, the controller 100 controls the microwave generator 16a so as to output microwave having a center frequency and a bandwidth. The controller 100 gives instructions for a setting frequency, setting power, and a setting bandwidth to the microwave generator 16a. The microwave generator 16a generates a microwave having a center frequency and a bandwidth on the basis of the setting frequency, the setting power, and the setting bandwidth.

Next, the controller 100 measures a frequency spectrum in step S12. The controller 100 controls the demodulator 29 to measure a frequency spectrum. Consequently, a frequency spectrum (a frequency spectrum related to the apparatus state A) at the first timing is be obtained.

Next, the controller 100 stores the frequency spectrum measured in step S12 into the storage unit 103 in step S14. The controller 100 stores the frequency spectrum into the storage unit 103 in correlation with the apparatus state A. The controller 100 may store the frequency spectrum into the storage unit 103 in a case where plasma generation conditions (a setting frequency, setting power, and a setting bandwidth).

When step S14 is finished, the flowchart of FIG. 9 is finished. The flowchart of FIG. 9 is executed, and thus a reference frequency spectrum is obtained in the same apparatus.

Figure 10:
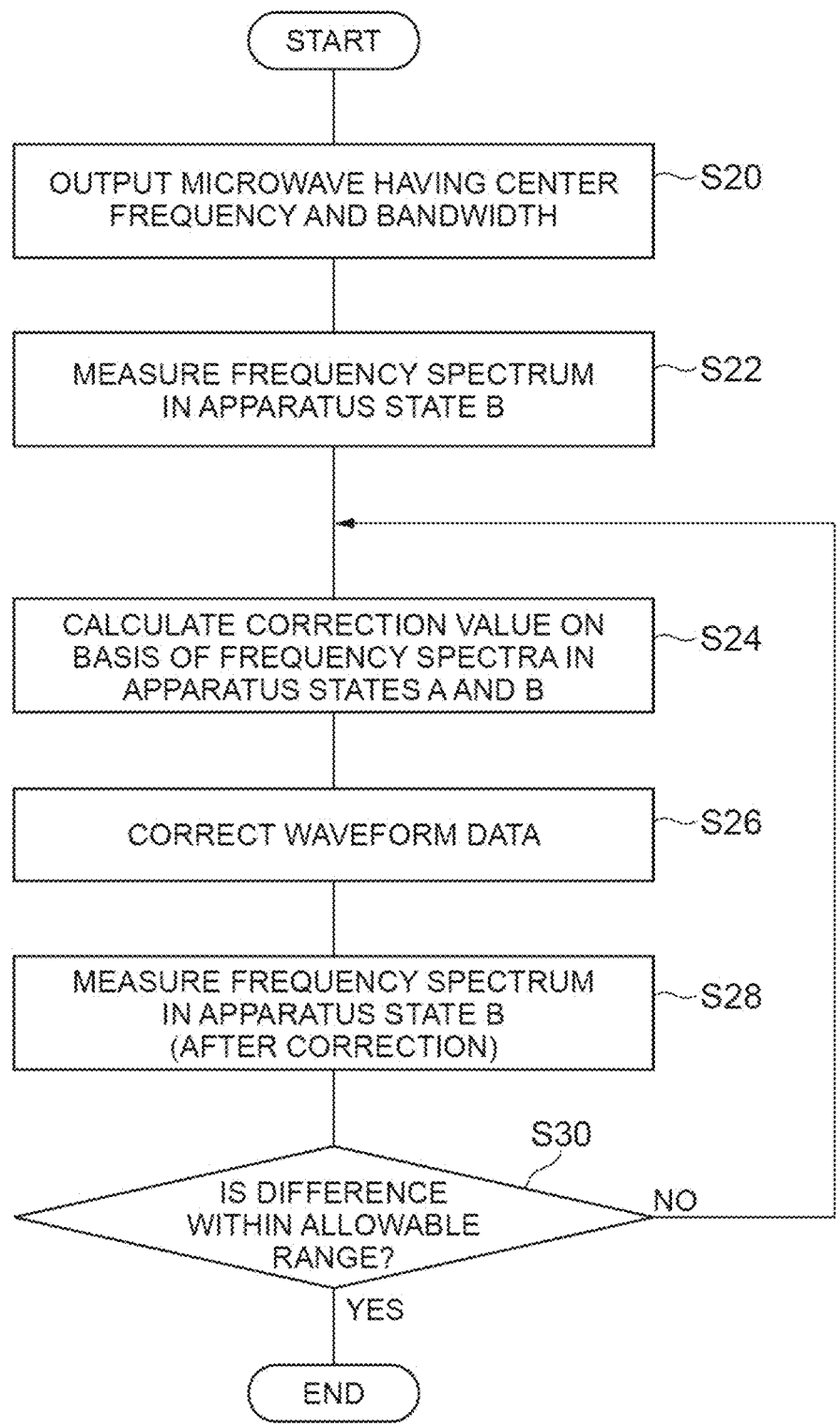
FIG. 10 is a flowchart of an example illustrating a microwave control method.

Next, correction using the reference value acquired by the same apparatus will be described. FIG. 10 is a flowchart illustrating an example of a microwave control method. The flowchart of FIG. 10 is executed by the controller 100. An execution time is the second timing, which is a timing at which time has elapsed from the first timing. The execution time may be, for example, a process execution time. Hereinafter, an apparatus state at the second timing is referred to as an apparatus state B.

First, in step S20, the controller 100 controls the microwave generator 16a to output a microwave having a center frequency and a bandwidth. The controller 100 gives instructions for a setting frequency, setting power, and a setting bandwidth to the microwave generator 16a. The setting frequency, the setting power, and the setting bandwidth are set to the same values as in step S10 in FIG. 9. The microwave generator 16a generates a microwave having a center frequency and a bandwidth on the basis of the setting frequency the setting power, and the setting bandwidth.

The controller 100 measures a frequency spectrum in step S22. The controller 100 controls the demodulator 29 to measure a frequency spectrum. Consequently, a frequency spectrum (a frequency spectrum related to the apparatus state B) at the second timing is obtained.

In step S24, the controller 100 calculates a correction value on the basis of the frequency spectra related to the apparatus states A and B. The controller 100 calculates a difference between the frequency spectrum related to the apparatus state A, corresponding to a reference value, and the frequency spectrum related to the apparatus state B corresponding to a measurement result, for each frequency. As a result, a correction value is prepared such that the above difference is small for each frequency.

In step S26, the controller 100 corrects a shape of the waveform data that is input to the waveform generation unit 161 on the basis of the correction value for each frequency. The controller 100 adjusts a waveform of the travelling wave power such that the above difference is small.

In step S28, the controller 100 performs the same processing as in step S22 by using the corrected waveform data. Consequently the corrected frequency spectrum is obtained.

In step S30, the controller 100 calculates a difference between the frequency spectrum related to the apparatus state A, corresponding to a reference value, and the frequency spectrum (after correction) related to the apparatus state B, corresponding to a measurement result, and determines whether or not the difference is within an allowable range. The allowable range is set in advance in order to determine completion of calculation. In a case where it is determined that the difference is not within the allowable range (step S30: NO), the controller 100 causes the process to proceed to step S24. As described above, the controller 100 repeatedly performs the processes from step S24 to step S30 until it is determined that the difference is within the allowable range.

In a case Where the controller 100 determines that the difference is within the allowable range (step S30: YES), the controller 100 finishes the flowchart of FIG. 10. The flowchart of FIG. 10 is executed, and thus the frequency spectrum related to the apparatus state B is corrected to approach the frequency spectrum related to the apparatus state A. That is, the correction is performed such that a microwave can be output in a form close to the past apparatus state. For example, the frequency spectrum illustrated in FIG. 8B can be corrected to the frequency spectrum illustrated in FIG. 8A.

Figure 11A:
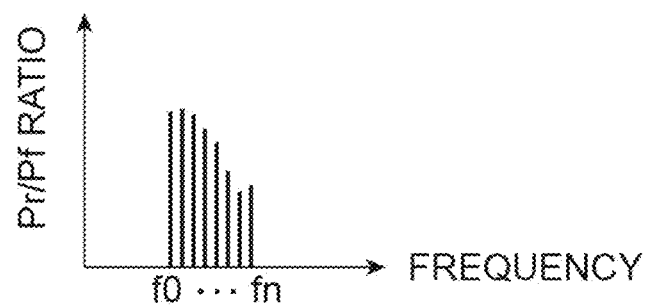
FIGS. 11A and 11B are diagrams illustrating examples of a frequency spectrum.
Figure 11B:
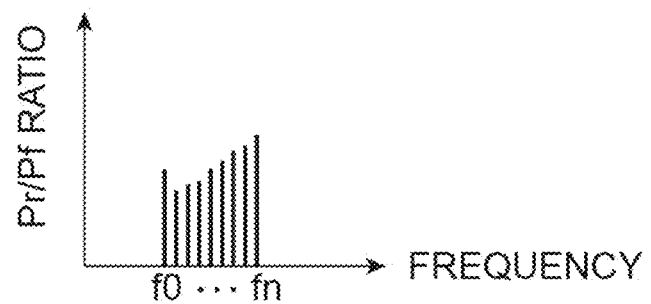

The microwave control method corresponding to a change over time of the apparatus is not limited to the above description. For example, the frequency spectrum may be corrected by using a frequency spectrum measured in a reference apparatus. FIGS. 11A and 11B are diagrams for describing examples of frequency spectra. FIG. 11A is a frequency spectrum obtained by a reference apparatus. The transverse axis represents a frequency, and the longitudinal axis represents the Pr/Pf ratio. A range from f0 to fn in FIG. 11A is a bandwidth of the frequency spectrum. The range from f0 to fn is a setting frequency. FIG. 11B is a frequency spectrum obtained by the plasma processing apparatus 1. The transverse axis represents a frequency, and the longitudinal axis represents the Pr/Pf ratio. A range from f0 to fn in FIG. 11B is a bandwidth of the frequency spectrum. The range from f0 to fn is a setting frequency. The controller 100 can correct the frequency spectrum (in FIG. 11B) to approach the frequency spectrum (in FIG. 11A) of the reference apparatus. For this purpose, the controller 100 stores the frequency spectrum (in FIG. 11A) of the reference apparatus in the storage unit 103 in advance.

Figure 12:
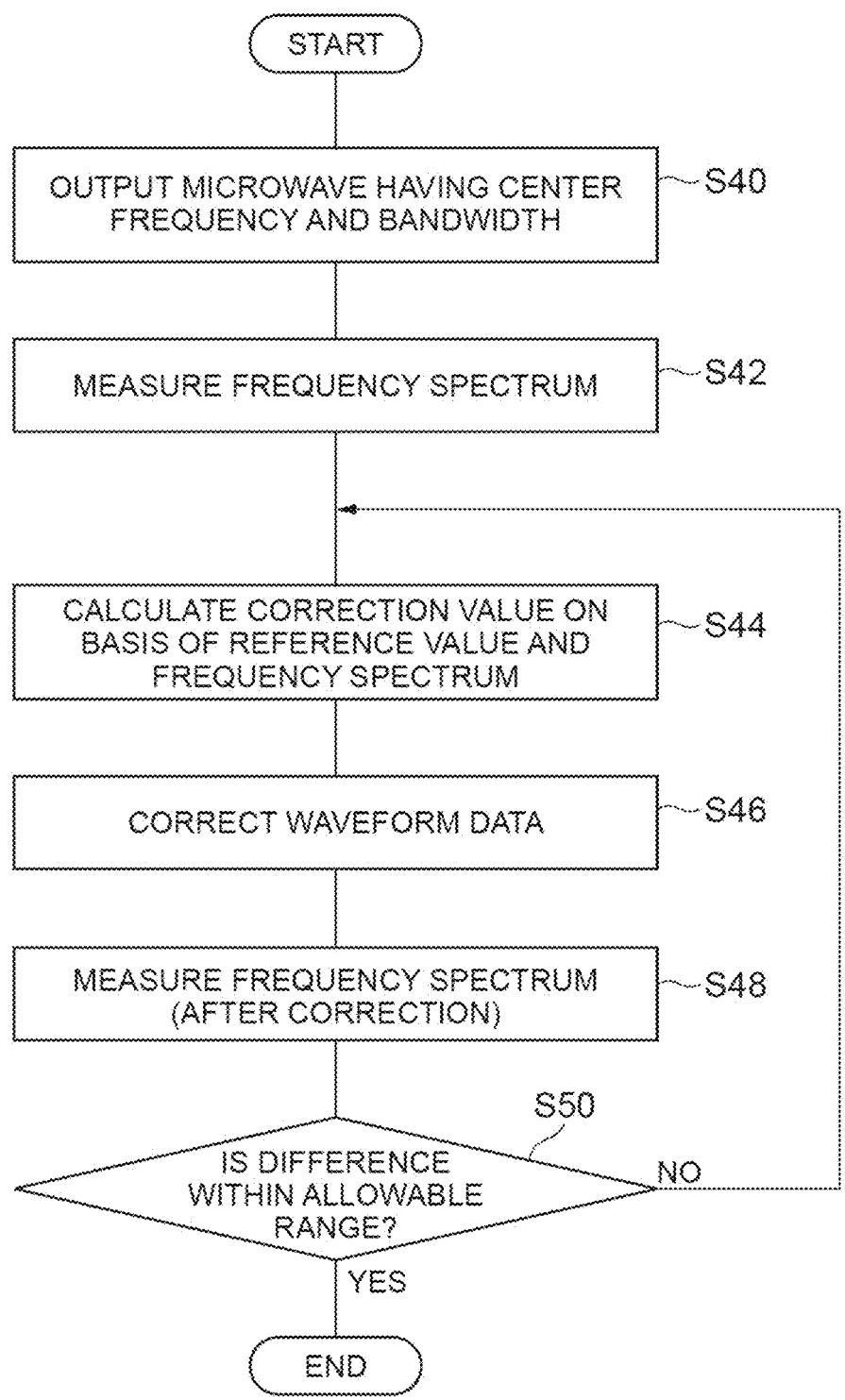
FIG. 12 is a flowchart of an example of a microwave control method.

FIG. 12 is a flowchart illustrates an example of a microwave control method. The flowchart of FIG. 12 is executed by the controller 100.

First, in step S40, the controller 100 controls the microwave generator 16a to output a microwave having a center frequency and a bandwidth. The controller 100 gives instructions for a setting frequency, setting power, and a setting bandwidth to the microwave generator 16a. The microwave generator 16a generates a microwave having a center frequency and a bandwidth on the basis of the setting frequency, the setting power, and the setting bandwidth.

The controller 100 measures a frequency spectrum in step S42. The controller 100 controls the demodulator 29 to measure a frequency spectrum. Consequently, a frequency spectrum is obtained.

The controller 100 calculates a correction value in step S44. The controller 100 refers to the storage unit 103 and acquires a frequency spectrum measured by another apparatus as a reference value. The controller 100 calculates a difference between the reference value and the frequency spectrum which is the measurement result for each frequency. Consequently, a correction value is prepared for each frequency such that the above difference is small.

In step S46, the controller 100 corrects a shape of waveform data that is input to the waveform generation unit 161 on the basis of the correction value for each frequency. The controller 100 adjusts a waveform of the travelling wave power such that the above difference is small.

In step S48, the controller 100 performs the same process as in step S42 by using the corrected waveform data. Consequently, the corrected frequency spectrum is obtained.

In step S50, the controller 100 calculates a difference between the frequency spectrum related to the apparatus state A, corresponding to a reference value, and the frequency spectrum (after correction) related to the apparatus state B, corresponding to a measurement result, and determines whether or not the difference is within an allowable range. The allowable range is set in advance in order to determine completion of calculation. In a case where it is determined that the difference is not within the allowable range (step S50: NO), the controller 100 causes the process to proceed to step S44. As described above, the controller 100 repeatedly performs the processes from step S44 to step S50 until it is determined that the difference is within the allowable range.

In a case where the controller 100 determines that the difference is within the allowable range (step S50: YES), the controller 100 finishes the flowchart of FIG. 12. The flowchart of FIG. 12 is executed, and thus the frequency spectrum is corrected to approach a frequency spectrum related to the reference apparatus. That is, the correction is performed such that a microwave can be output in a form close to a reference apparatus state. For example, the frequency spectrum illustrated in FIG. 11B can be corrected to the frequency spectrum illustrated in FIG. 11A.

Figure 13A:
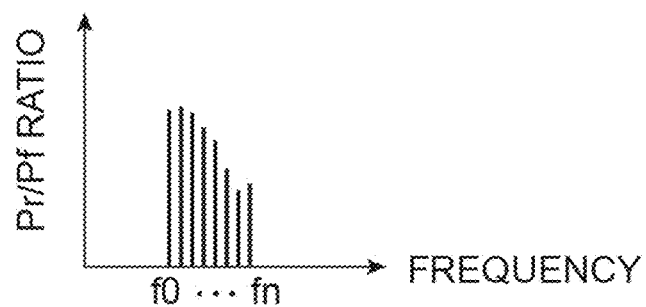
FIGS. 13A, 13B, and 13C are diagrams illustrating examples of a frequency spectrum.
Figure 13B:
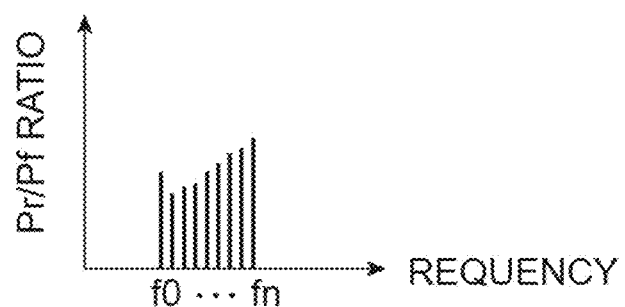
Figure 13C:
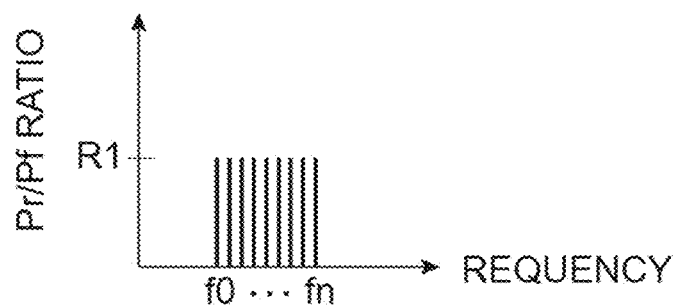

The reference frequency spectrum described above may be a set value instead of a measured value. FIGS. 13A, 13B, and 13C are diagrams for describing examples of frequency spectra. FIG. 13A illustrates a frequency spectrum in a first apparatus. FIG. 13B illustrates a frequency spectrum in a second apparatus. FIG. 13C illustrates a set value R1 for each frequency. In FIGS. 13A, 13B, and 13C, a transverse axis represents frequency and a longitudinal axis represents the Pr/Pf ratio. A range from f0 to fn in FIGS. 13A to 13C is a bandwidth of the frequency spectrum. The range from f0 to fn is a setting frequency. The controller 100 may use the set value R1 illustrated in FIG. 13C as a reference value. In this case, the controller 100 stores the set value R1 into the storage unit 103. The controller 100 may refer to the storage unit 103 and correct the frequency spectra illustrated in FIGS. 13A and 13B to the set value R1 illustrated in FIG. 13C. Since this operation is the same as the operation illustrated in FIG. 12, the description thereof will not be repeated.

As described above, according to the plasma processing apparatus 1 and the microwave control method, a microwave is generated in correspondence to a setting frequency, setting power, and a setting bandwidth at the first timing. The travelling wave power and the reflected wave power of the microwave are measured for each frequency. Consequently, a frequency spectrum is obtained at the first timing. At the second timing at which time has elapsed from the first timing, a microwave is generated under the same conditions, and a frequency spectrum is obtained. A correction value for correcting a waveform of the travelling wave power is calculated for each frequency such that a difference between the frequency spectrum related to the second timing and the frequency spectrum related to the first timing stored in the storage unit 103 for each frequency is small. The waveform of the travelling wave power is corrected on the basis of the calculated correction value for each frequency. As described above, in the plasma processing apparatus 1 and the microwave control method, at the second timing, a waveform of the travelling wave power can be corrected such that a difference between the reference value and the frequency spectrum for each frequency is small with an apparatus state at the first timing as a reference. Thus, according to the plasma processing apparatus 1 and the microwave control method, it is possible to reduce a characteristic change in a microwave from the reference apparatus state.

According to the plasma processing apparatus 1 and the microwave control method, it is not necessary to separately prepare a diagnosis recipe, and it is possible to minimize a difference between a diagnosis result in the diagnosis recipe and a diagnosis result at the time of executing the process recipe. Since the plasma processing apparatus can perform correction at the time of executing the process recipe, the productivity can be improved compared with a case where the diagnosis recipe is employed.

According to the plasma processing apparatus 1 and the microwave control method, it is possible to use an apparatus state at the introduction timing or the maintenance timing of the apparatus as a reference.

According to the plasma processing apparatus 1 and the microwave control method, respective reference values corresponding to frequencies in a frequency spectrum at a setting frequency, setting power, and a setting bandwidth are acquired. The microwave is generated in correspondence to the setting frequency, the setting power, and the setting bandwidth. The travelling wave power and the reflected wave power of the microwave are measured for each frequency. Consequently, a frequency spectrum is obtained. A correction value for correcting the waveform of the travelling wave power is calculated for each frequency such that a difference for each frequency between the frequency spectrum and the corresponding reference value is small. The waveform of the travelling wave power is corrected on the basis of the calculated correction value for each frequency. As described above, according to the plasma processing apparatus 1 and the microwave control method, it is possible to correct a waveform of the travelling wave power with a reference value acquired in advance as a reference such that a difference for each frequency between the reference value and the frequency spectrum is small. Thus, according to the plasma processing apparatus 1 and the microwave control method, it is possible to reduce a characteristic change in a microwave from the reference apparatus state. According to the plasma processing apparatus 1 and the microwave control method, it is possible to also reduce an individual difference of apparatuses.

As mentioned above, various embodiments have been described, but the present disclosure is not limited to the embodiments, and may be variously modified. For example, the respective embodiments may be combined with each other.

From the above description, it is understood that the embodiments of the present disclosure are described in the present specification for the purposes of explanation and that various modifications can be made without departing from the scope and the spirit of the present disclosure. Therefore, the various embodiments disclosed in the present specification are not intended to be limited, and the true scope and spirit are shown by the accompanying claims.

What is claimed is:

1. An apparatus for processing a substrate with plasma, comprising:
   a chamber provided with an antenna and configured to accommodate the substrate;
   a microwave generator configured to generate a microwave having a center frequency, power, and a bandwidth respectively corresponding to a setting frequency, setting power, and a setting bandwidth;
   a waveguide configured to guide the microwave output by the microwave generator to the antenna;
   a demodulator provided in the waveguide and configured to measure travelling wave power and reflected wave power of the microwave for each frequency; and
   a controller connected to the microwave generator and the demodulator and has a storage unit, wherein
   the controller is configured to
      control the microwave generator to generate the microwave in correspondence to the setting frequency, the setting power, and the setting bandwidth at a first timing,
      control the demodulator to measure the travelling wave power and the reflected wave power of the microwave for each frequency, and calculates a frequency spectrum that is a ratio between the travelling wave power and the reflected wave power for each frequency on the basis of a measurement result from the demodulator,
      store the frequency spectrum related to the first timing into the storage unit,
      control the microwave generator to generate the microwave in correspondence to the setting frequency, the setting power, and the setting bandwidth at a second timing at which time has elapsed from the first timing,
      control the demodulator to measure the travelling wave power and the reflected wave power of the microwave for each frequency, and calculates the frequency spectrum related to the second timing on the basis of a measurement result from the demodulator,
      calculate a correction value for correcting a waveform of the travelling wave power for each frequency such that a difference for each frequency between the frequency spectrum related to the second timing and the frequency spectrum related to the first timing, stored in the storage unit, is small, and control the microwave generator to correct the waveform of the travelling wave power on the basis of the calculated correction value for each frequency.

2. The apparatus according to claim 1, wherein the setting frequency, the setting power, and the setting bandwidth are the same as a setting frequency, setting power, and a setting bandwidth during plasma processing on the substrate.

3. The apparatus according to claim 1, wherein the first timing is an introduction timing of the apparatus or a maintenance timing of the apparatus.

4. An apparatus for processing a substrate with plasma, comprising:

a chamber provided with an antenna and configured to accommodate the substrate;

a microwave generator configured to generate a microwave having a center frequency, power, and a bandwidth respectively corresponding to a setting frequency, setting power, and a setting bandwidth;

a waveguide configured to guide the microwave output by the microwave generator to the antenna;

a demodulator provided in the waveguide and configured to measure travelling wave power and reflected wave power of the microwave for each frequency; and a controller connected to the microwave generator and the demodulator, wherein the controller is configured to acquire a reference value corresponding to each of frequencies in a frequency spectrum at the setting frequency, the setting power, and the setting bandwidth, control the demodulator to measure the travelling wave power and the reflected wave power for each frequency, and calculates a frequency spectrum that is a ratio between the travelling wave power and the reflected wave power for each frequency, calculate a correction value for correcting a waveform of the travelling wave power of the microwave for each frequency such that a difference for each frequency between the frequency spectrum and the corresponding reference value is small, and correct the waveform of the travelling wave power of the microwave on the basis of the calculated correction value.

5. The apparatus according to claim 4, wherein the reference value is a constant.

* * * * *